(12) United States Patent
Shin

(10) Patent No.: US 10,600,622 B2
(45) Date of Patent: Mar. 24, 2020

(54) FOCUS RING WITH UNEVEN PATTERN AND PLASMA-PROCESSING APPARATUS INCLUDING THE SAME

(71) Applicant: SAMSUNG ELECTRONICS CO., LTD., Suwon-si, Gyeonggi-do (KR)

(72) Inventor: Jaeseong Shin, Suwon-si (KR)

(73) Assignee: SAMUSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 199 days.

(21) Appl. No.: 15/682,854

(22) Filed: Aug. 22, 2017

(65) Prior Publication Data

US 2018/0190475 A1 Jul. 5, 2018

(30) Foreign Application Priority Data

Jan. 4, 2017 (KR) .......................... 10-2017-0001317

(51) Int. Cl.
*H01J 37/32* (2006.01)
*H01L 21/3065* (2006.01)

(52) U.S. Cl.
CPC .. *H01J 37/32642* (2013.01); *H01J 37/32082* (2013.01); *H01J 37/32174* (2013.01); *H01L 21/3065* (2013.01)

(58) Field of Classification Search
CPC ........... H01J 37/32642; H01J 37/32174; H01J 37/32082; H01L 21/3065
See application file for complete search history.

(56) References Cited

U.S. PATENT DOCUMENTS

| | | | | |
|---|---|---|---|---|
| 5,685,914 A | * | 11/1997 | Hills ................ | H01J 37/32449 118/723 E |
| 6,464,794 B1 | * | 10/2002 | Park .................... | C23C 16/4583 118/724 |
| 6,726,799 B2 | * | 4/2004 | Koike ............... | H01J 37/32642 118/695 |
| 7,422,637 B2 | | 9/2008 | Ku et al. | |
| 7,987,814 B2 | | 8/2011 | Carducci et al. | |
| 8,057,633 B2 | | 11/2011 | Tsukamoto et al. | |
| 9,123,661 B2 | | 9/2015 | Kellogg | |
| 2003/0119328 A1 | * | 6/2003 | Fujisato ............. | C23C 16/4405 438/709 |
| 2005/0005859 A1 | * | 1/2005 | Koshiishi .......... | H01J 37/32642 118/728 |
| 2006/0102288 A1 | * | 5/2006 | Satoh ................ | H01J 37/32642 156/345.51 |

(Continued)

FOREIGN PATENT DOCUMENTS

| | | |
|---|---|---|
| KR | 10-2003-0042551 A | 6/2003 |
| KR | 10-2005-0060180 A | 6/2005 |
| WO | WO 2006/137653 * 12/2006 | ......... H01L 21/3065 |

OTHER PUBLICATIONS

Babaeva, Natalia Y., et al., "Penetration of plasma into the wafer-focus ring gap in capacitively coupled plasmas". Journal of Applied Physics, 101, 113307, 2007, pp. 1-11.*

(Continued)

*Primary Examiner* — Bret P Chen
(74) *Attorney, Agent, or Firm* — Lee IP Law, P.C.

(57) ABSTRACT

A focus ring includes a main body and a plurality of unit structures. The main body has a ring shape. The unit structures are arranged in an uneven pattern and protrude from an upper surface of the main body.

20 Claims, 11 Drawing Sheets

(56) References Cited

U.S. PATENT DOCUMENTS

| | | | |
|---|---|---|---|
| 2006/0118243 A1* | 6/2006 | Choi | H01L 21/67109 156/345.51 |
| 2008/0066868 A1* | 3/2008 | Masuda | H01J 37/32623 156/345.51 |
| 2009/0255902 A1* | 10/2009 | Satoh | H01J 37/32642 216/67 |
| 2010/0213171 A1* | 8/2010 | Koshimizu | H01J 37/32091 216/67 |
| 2011/0315318 A1* | 12/2011 | Kobayashi | H01J 37/32642 156/345.27 |
| 2013/0264035 A1 | 10/2013 | Goel et al. | |
| 2014/0146434 A1* | 5/2014 | Uchida | H01L 21/6831 361/234 |
| 2014/0202631 A1 | 7/2014 | Kanbara et al. | |
| 2014/0209245 A1 | 7/2014 | Yamamoto et al. | |
| 2014/0273486 A1 | 9/2014 | Katsunuma et al. | |
| 2016/0035543 A1 | 2/2016 | Kobayashi et al. | |
| 2016/0042926 A1 | 2/2016 | Ishikawa et al. | |
| 2016/0196981 A1 | 7/2016 | Katsunuma et al. | |

OTHER PUBLICATIONS

Tong, Lizhu, "Effects of gas composition, focus ring and blocking capacitor on capacitively coupled RF Ar/H2 plasmas". Jpn. J. Appl . Phys. 54 2015, 06GA01, pp. 1-5.*

Yang, Kyung Chae, et al., "Effect of Structure and Material Variation of Focus Ring for Enhanced Etch Resistance". Nanoscience and Nanotechnology Letters, vol. 9, 24-29, 2017, pp. 24-29.*

Jafari, Hossein, et al., "Design and construction of a very low energy plasma focus, operating at repetitive discharge mode and pinching evidences". Physics Letters A 381 (2017) 2813-2820.*

* cited by examiner

FOCUS RING WITH UNEVEN PATTERN AND PLASMA-PROCESSING APPARATUS INCLUDING THE SAME

CROSS-REFERENCE TO RELATED APPLICATION

Korean Patent Application No. 10-2017-0001317, filed on Jan. 4, 2017, and entitled, "Focus Ring and Plasma-Processing Apparatus Including the Same," is incorporated by reference herein in its entirety.

BACKGROUND

1. Field

One or more embodiments described herein relate to a focus ring and a plasma-processing apparatus including a focus ring.

2. Description of the Related Art

Plasma has been used in processes for manufacturing semiconductor devices, display panels, solar cells, and other products. Examples of plasma processes include dry etching, plasma-enhanced chemical vapor deposition, sputtering, and ashing. These processes may use capacitively coupled plasma, inductively coupled plasma, helicon plasma, or microwave plasma. However, process characteristics may not remain uniform, especially as the size and integration of electronics products increase.

SUMMARY

In accordance with one or more embodiments, a focus ring includes a main body having a ring shape; and a plurality of unit structures arranged in an uneven pattern and protruding from an upper surface of the main body to a height.

In accordance with one or more other embodiments, a plasma-processing apparatus includes a chamber; an upper electrode in the chamber; a lower electrode facing the upper electrode in the chamber and supporting a wafer; and a focus ring, surrounding an outer circumference of the wafer, on the lower electrode, wherein a trench is in an upper portion of the focus ring and wherein the trench extends from an upper surface of the focus ring to a depth.

In accordance with one or more other embodiments, a focus ring includes a main body having a ring shape; and a plurality of unit structures adjacent to the main body, wherein the plurality of unit structures are spaced from one another and wherein the plurality of unit structures extend from the main body to heights or widths, or both, that change in a predetermined direction.

BRIEF DESCRIPTION OF THE DRAWINGS

Features will become apparent to those of skill in the art by describing in detail exemplary embodiments with reference to the attached drawings in which.

DETAILED DESCRIPTION OF THE EMBODIMENTS

Figure 1A:
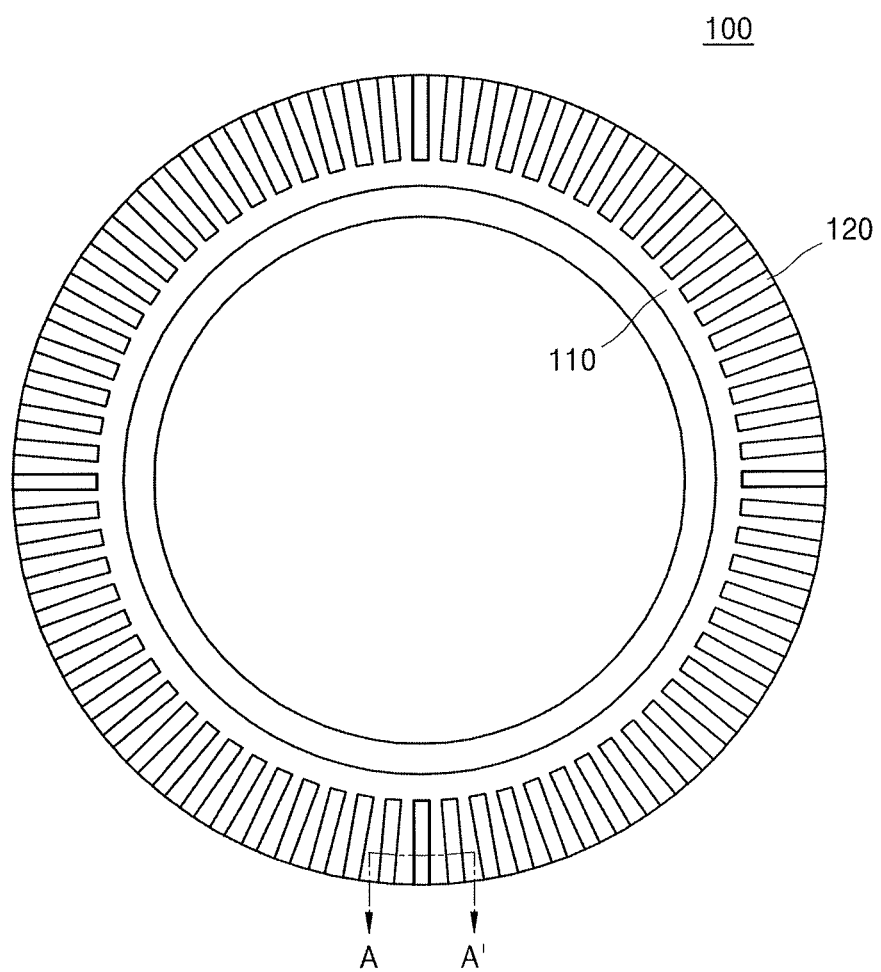
FIG. 1A illustrates an embodiment of a focus ring.
Figure 1B:
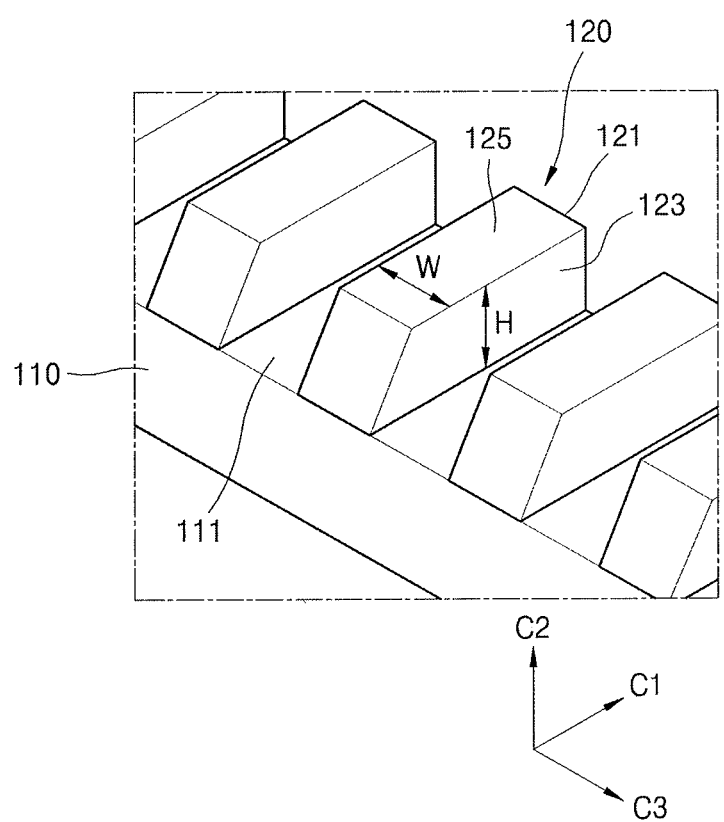
FIG. 1B illustrates a portion of the focus ring.

FIG. 1A illustrates a plan view of an embodiment of a focus ring 100, and FIG. 1B illustrates a perspective view of a portion of the focus ring 100 in FIG. 1A. Referring to FIGS. 1A and 1B, the focus ring 100 may have a ring shape and may include a main body 110 and an uneven pattern 120.

The focus ring 100 may be used to perform a semiconductor manufacturing process that includes a plasma process, for example, an etching process, a deposition process, or the like. The focus ring 100 may be on a lower electrode (e.g., 210 of FIG. 8) within a plasma-processing apparatus (e.g., 1000 of FIG. 8) and may surround an outer circumference of a wafer.

When radio frequency (RF) power for generating plasma is applied to the lower electrode and/or an upper electrode (e.g., 220 of FIG. 8), high-frequency power is applied to the focus ring 100. Thus, an electric field formation area may expand to a portion around the focus ring 100. As the electric field formation area expands due to the focus ring 100, plasma generated within a chamber of the plasma-processing apparatus may further expand. Accordingly, uniformity of the plasma may increase around an edge portion of the wafer, and process characteristics of a central portion and the edge portion of the wafer may be increasingly uniform.

In some embodiments, the focus ring 100 may include a dielectric material, an insulating material, a semiconductor, or a combination thereof. For example, focus ring 100 may include silicon (Si), silicon carbide (SiC), carbon (C), or a combination thereof.

The main body 110 may form an entire exterior of the focus ring 100 and may have a ring shape like the focus ring 100. The focus ring 100 includes the main body 110 and the uneven pattern 120, where the main body 110 may be a portion of the focus ring 100 other than the uneven pattern 120.

The uneven pattern 120 may be on an upper surface 111 of the main body 110. The uneven pattern 120 may include unit structures 121 protruding to a predetermined height from the upper surface 111 of the main body 110. When the focus ring 100 is on the lower electrode, a lower surface of the main body 110 may contact the lower electrode. The uneven pattern 120 on the upper surface 111 of the main body 110 may be exposed to the plasma during the plasma process.

The unit structure 121 may have a predetermined shape. In some embodiments, the unit structure 121 may have a line shape or a bar shape extending in a first direction C1. The unit structure may have a different shape in another embodiment. Unit structures 121 may be spaced apart from each other at predetermined intervals. For example, the unit structures 121 may be spaced apart from each other at radially identical intervals. Some of ions and/or radicals moving in a direction from the wafer towards the focus ring 100 may pass through adjacent unit structures 121. The first direction C1 may be, for example, a radial direction.

The uneven pattern 120 may be formed by trenches 123 formed after upper portions of the focus ring 100 are removed. Adjacent unit structures 121 may be spaced apart from each other, with the trenches 123 therebetween. The trenches 123 may partially expose the upper surface 111 of the main body 110. In some embodiments, the trench 123 may have a line shape extending in the first direction C1. The trench 123 may have a different shape in another embodiment.

Since high-frequency power is applied when the focus ring 100 is exposed to reactive plasma, the focus ring 100 may be consumed as the result of physical and/or chemical reactions that occur due to plasma. Accordingly, while a plasma treatment process may be performed, a dimension (e.g., height H) of the focus ring 100 may temporally change. A temporal change of the focus ring 100 may allow the electric field formation area around the focus ring 100 to temporally change, which may cause process characteristics of the edge portion of the wafer to be non-uniform.

Figure 1C:
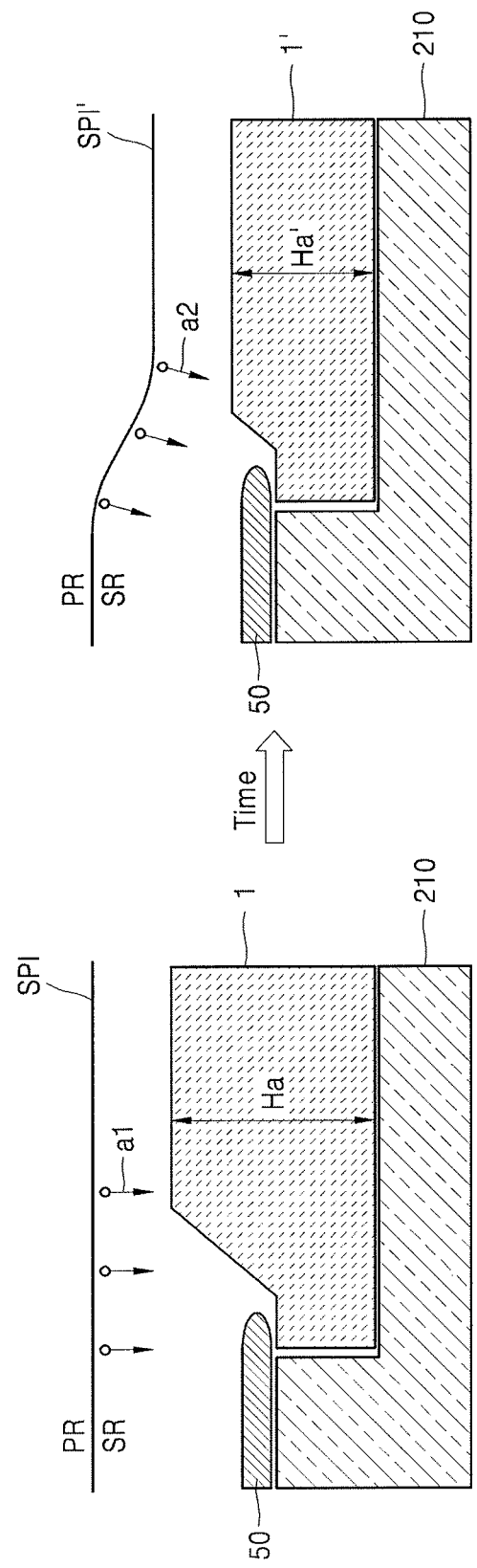
FIG. 1C illustrates an example of a temporal change of a proposed focus ring resulting from plasma-induced physical and/or chemical reactions.

FIG. 1C illustrates an example of a temporal change of one type of proposed focus ring 1 that may occur as a result of physical and/or chemical reactions caused by plasma. Referring to FIG. 1C, in an initial state, a sheath-plasma interface SPI (which is an interface of a plasma region PR and a sheath region SR) may be planar. That is, the level of the sheath-plasma interface SPI above a wafer 50 may be substantially the same as a level of the sheath-plasma interface SPI above the focus ring 1. In this case, ions around an edge portion of the wafer 50 may be incident to the edge portion of the wafer 50 in a vertical direction a1.

As time passes from the initial state, a focus ring 1' may be consumed as a result of physical and/or chemical reactions that occur due to plasma. In the initial state, the focus ring 1 may have a first height Ha. After a certain period of time has passed, the focus ring 1' may have a second height Ha' lower than the first height Ha.

When the height of the focus ring 1' decreases compared to its initial height because of consumption of the focus ring 1', the level of a sheath-plasma interface SPI' above the focus ring 1 may be lower than a level of the sheath-plasma interface SPI' above the wafer 50. The difference between the level of the sheath-plasma interface SPI' above the focus ring 1' and the level of the sheath-plasma interface SPI' above the wafer 50 may change an ion incidence direction in which ions are incident to the wafer 50. For example, in the vicinity of the edge portion of the wafer 50, ions may be incident to the edge portion of the wafer 50 in a direction a2 that is inclined at a certain angle with respect to the vertical direction a1. As the height of the wafer 50 decreases, the inclination of the ion incidence direction may increase in the vertical direction a1.

A change in the ion incidence direction may result in non-uniformity of process characteristics of the edge portion of the wafer 50. Thus, when the height of the focus ring 1 exceeds a certain range from its initial height, or when the height of the focus ring 1 is lower than or equal to a certain height, the lifetime of the focus ring 1 may end.

Referring again to FIGS. 1A and 1B, in the focus ring 100 according to embodiments, the uneven patterns 120 increase a surface area of the focus ring 100. As a result, the surface area of the focus ring 100 that physically and/or chemically reacts with plasma may relatively increase. Accordingly, during the plasma process, the rate of the temporal change of the focus ring 100 may decrease. For example, the uneven patterns 120 increase the surface area of the focus ring 100 reacting with the plasma. Thus, the rate of decrease of the height of the focus ring 100 may decrease.

Thus, when the focus ring 100 according to embodiments is used, a problem associated with non-uniformity of process characteristics of an edge portion of the wafer due to the temporal change of the focus ring 100 may be solved. Additionally, the rate of height decrease of the focus ring 100 is reduced, which increases useful life of the focus ring 100.

Figure 2A:
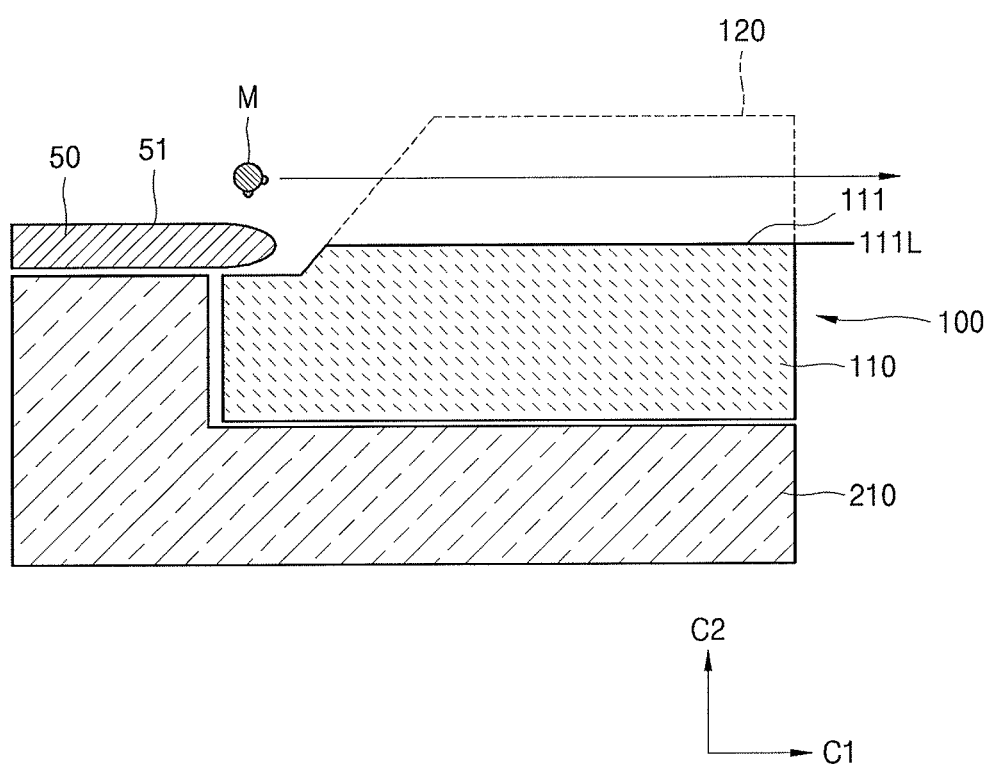
FIG. 2A illustrates an embodiment of a cross-sectional view of a focus ring on a lower electrode.
Figure 2B:
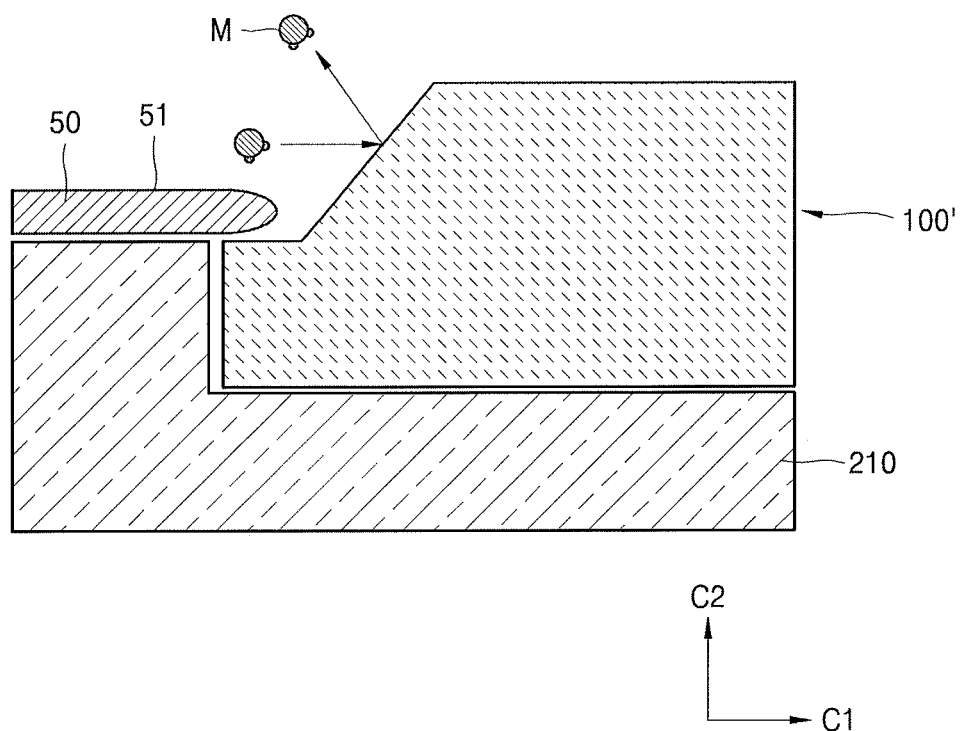
FIG. 2B illustrates a comparative example of a focus ring with a flat surface on a lower electrode.
Figure 2C:
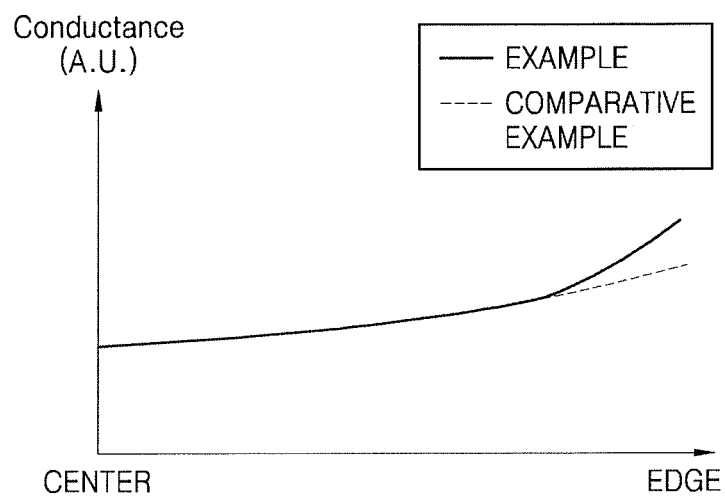
FIG. 2C illustrates an example of the conductance of the focus rings in FIGS. 2A and 2B.

FIG. 2A illustrates an embodiment of a cross-sectional view of the focus ring 100 on a lower electrode 210. FIG. 2B illustrates a comparative example of a cross-sectional view of a focus ring 100' with a flat surface on the lower electrode 210. FIG. 2C is a graph illustrating examples of conductance of the focus rings 100 and 100' in FIGS. 2A and 2B.

Referring to FIGS. 1A, 1B, and 2A, the focus ring 100 may be on the lower electrode 210 and may surround the wafer 50. When the focus ring 100 on the lower electrode 210 surrounds an outer circumference of the wafer 50, an upper surface of the focus ring 100 (e.g., an upper surface 125 of the uneven pattern 120) may be at a higher level than an upper surface 51 of the wafer 50.

The upper surface 111 of the main body 110 may have a uniform height level. The upper surface 111 of the main body 110 may be substantially parallel to the lower surface of the main body 110. However, the upper surface 111 of the main body 110 may be an inclined surface, for example, as in FIGS. 6A and 6B.

The upper surface 125 of the unit structure 121 may have a uniform height level. For example, when the focus ring 100 is on the lower electrode 210, the upper surface 125 of the unit structure 121 may be substantially parallel to the upper surface 51 of the wafer 50. In one embodiment, the upper surface 125 of the unit structure 121 may be substantially parallel to the lower surface of the main body 110. However, the upper surface 125 of the unit structure 121 may be an inclined surface, as in FIGS. 5A and 5B.

In some embodiments, a height level 111L of the upper surface 111 of the main body 110 may be lower than a level of the upper surface 51 of the wafer 50. In comparison with the case where the height level 111L of the upper surface 111 of the main body 110 is higher than the level of the upper surface 51 of the wafer 50, the ratio of a height of the uneven pattern 120 to a total height of the focus ring 100 increases. Therefore, a path through which ions and/or radicals M flow may increase in size in the focus ring 100.

The height level 111L of the upper surface 111 of the main body 110 may be the same as or higher than the level of the upper surface 51 of the wafer 50. The ratio of the height of the uneven pattern 120 to the total height of the focus ring 100 may be properly adjusted according to a type of a plasma treatment process and a process recipe.

When the focus ring 100 on the lower electrode 210 surrounds the outer circumference of the wafer 50, the trenches 123 may extend from the upper surface of the focus ring 100 and may be at a lower level than the upper surface 51 of the wafer 50. However, the trenches 123 may extend from the upper surface of the focus ring 100 and be at the same level as or a higher level than the upper surface 51 of the wafer 50.

As illustrated in FIG. 2A, the ions and/or radicals M around the edge portion of the wafer 50 may move in a direction from the wafer 50 towards the focus ring 100. In the vicinity of the edge portion of the wafer 50 and the focus ring 100, some of the ions and/or radicals M may move along a space between adjacent unit structures 121.

As illustrated in FIG. 2B, the focus ring 100' according to the comparative example may have a flat surface. The ions and/or radicals M passing the edge portion of the wafer 50 may collide with the focus ring 100'. For example, in a process pressure condition of between about 300 mTorr and about 500 mTorr, the ions and/or radicals M may move according to molecular flow. In this case, the ions and/or radicals M moving towards a surface of the focus ring 100' may not move along the surface of the focus ring 100', but may reflect after the ions and/or radicals M collide with the focus ring 100'. The ions and/or radicals M that collide with the focus ring 100' and then reflect may continuously collide with other ions and/or radicals M.

As illustrated in FIG. 2C, when the focus ring 100' has a flat surface, since a possibility that the ions and/or radicals M collide with the focus ring 100' or that the ions and/or radicals M colliding with the focus ring 100' collide with other ions and/or radicals M increases, the distance of a mean free path of the ions and/or radicals M around the edge portion of the wafer 50 decreases. For example, since the focus ring 100' disturbs movement of the ions and/or radicals M, conductance of the ions and/or radicals M around the edge portion of the wafer 50 may decrease.

Since the focus ring 100 according to embodiments includes the uneven pattern 120 that provides a path through which the ions and/or radicals M pass, the focus ring 100 may increase the conductance of the ions and/or radicals M, compared to the focus ring 100' having the same height as the focus ring 100. Accordingly, the focus ring 100 increases the conductance of the ions and/or radicals M around the edge portion of the wafer 50 and the focus ring 100. As a result, the process characteristics of the edge portion of the wafer 50 may become uniform. Also, although the height of the focus ring 100 increases, the conductance of the ions and/or radicals M may remain uniform to some extent. Thus, the useful life of the focus ring 100 may increase.

Figure 3A:
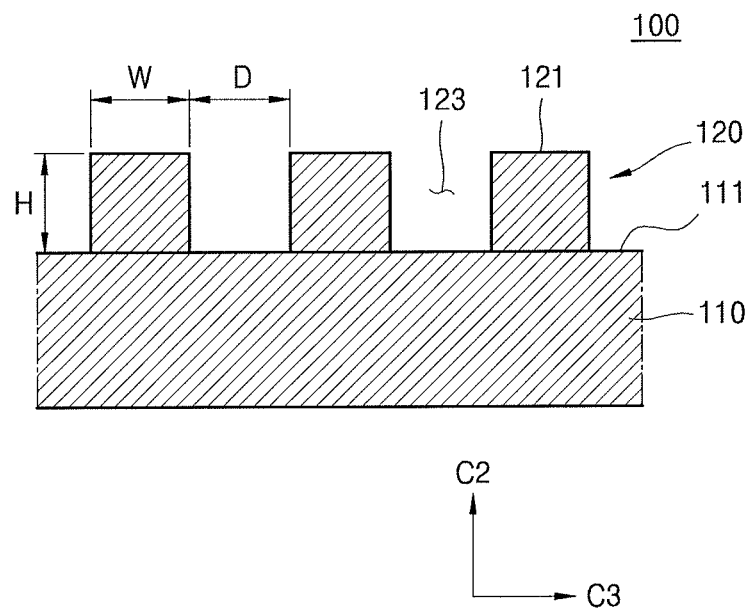
FIGS. 3A and 3B illustrate embodiments of cross-sectional views of focus rings along line A-A' of FIG. 1A.
Figure 3B:
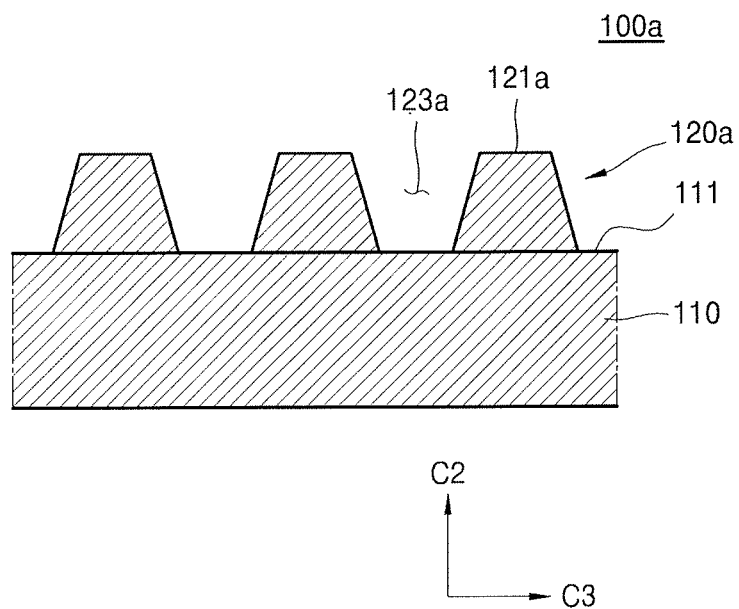

FIG. 3A illustrates an embodiment of a cross-sectional view of focus ring 100, and FIG. 3B illustrates another embodiment of a cross-sectional view of a focus ring 100*a*, both taken along a line A-A' of FIG. 1A.

Referring to FIGS. 1A, 1B, and 3A, focus ring 100 may include the main body 110 and the uneven pattern 120 including the unit structures 121 protruding from the upper surface 111 of the main body 110 to a certain height. The unit structure 121 may have a first height H in a second direction C2 and a first width W in a third direction C3. The second direction C2 may be a height direction or a thickness direction of the focus ring 100. In one embodiment, referring to FIG. 2A, the second direction C2 may be perpendicular to the upper surface 51 of the wafer 50. Also, the third direction C3 may be a tangential direction and may be perpendicular to the second direction C2.

A distance D between adjacent unit structures 121 may be properly adjusted to reduce plasma passing between the adjacent the unit structures 121. For example, the distance D between the adjacent unit structures 121 may be between about 0.4 mm and about 0.6 mm. The distance D may be different in another embodiment. The distance D between the adjacent unit structures 121 may be properly set, for example, according to the type of a plasma process and/or a process recipe.

In some embodiments, the unit structures 121 may have uniform first widths W and may extend in the second direction C2. In this case, the trenches 123 may have uniform widths and may extend in the second direction C2. Also, the unit structures 121 may have uniform widths W and may extend in the first direction C1. In this case, the trenches 123 may have uniform widths and extend in the first direction C1.

In some embodiments, the unit structures 121 may be spaced apart from each other at regular intervals. For example, the distance D between the adjacent unit structures 121 may be identical to the widths of the unit structures 121. This distance D may be different in another embodiment.

Referring to FIG. 3B, unit structures 121*a* may have different widths depending on locations thereof in the second direction C2. For example, the unit structure 121*a* may have a width that decreases upwards in a horizontal direction. For example, the width of unit structure 121*a* may decrease away from the upper surface 111 of the main body 110. Trenches 123*a* may have different widths depending on their depths. For example, trench 123*a* may have a width that decreases downwardly in a circumferential direction.

Since uneven patterns 120*a* include the unit structures 121*a* with shapes that decrease upwardly, each unit structure 121*a* may have an inclined side wall. As widths of upper portions of trenches 123*a* (through which ions and/or radicals mainly pass) increase, and widths of upper portions of uneven patterns 120*a* (with which the ions and/or radicals mainly collide) decrease, the conductance of the ions and/or radicals may increase.

Figure 4A:
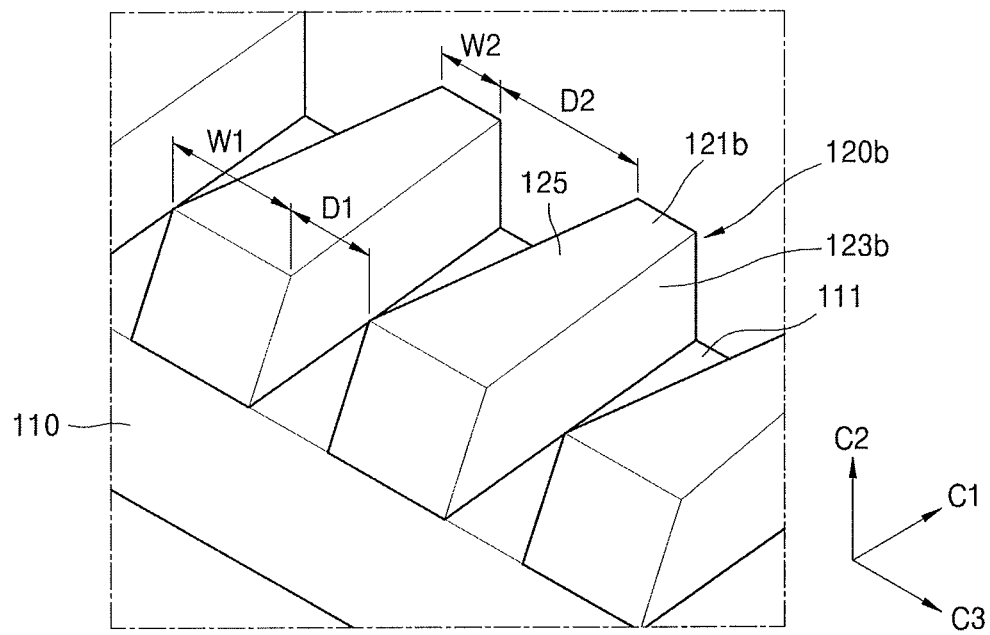
FIGS. 4A and 4B illustrate embodiments of enlarged portions of a focus ring.
Figure 4B:
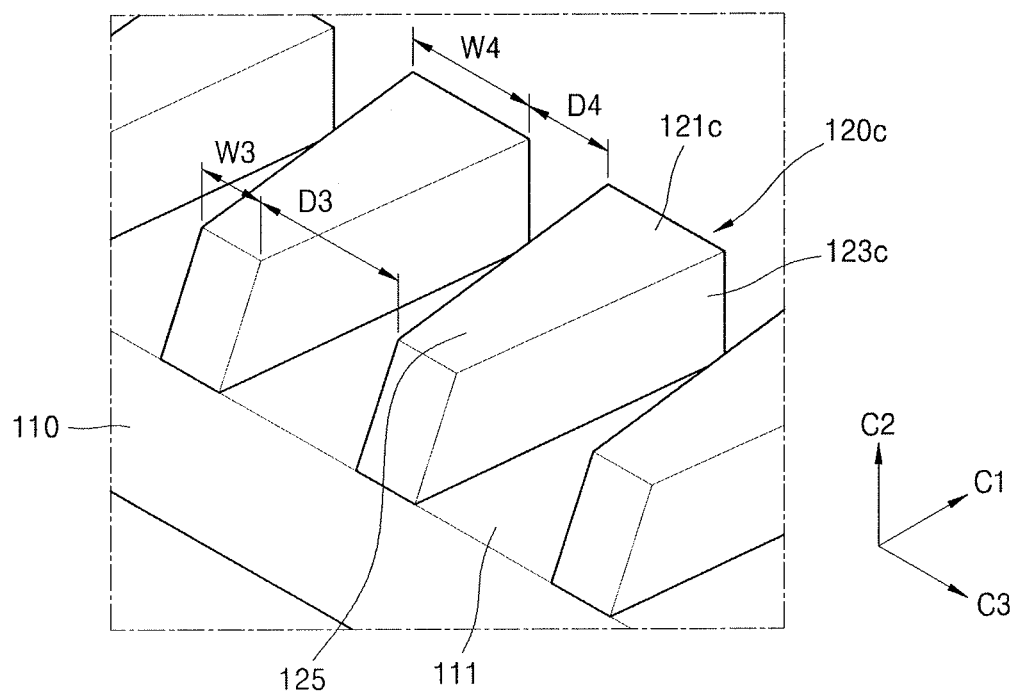

FIGS. 4A and 4B illustrate embodiments of perspective views of enlarged portions of a focus ring. Referring to FIG. 4A, the focus ring may include uneven patterns 120*b* including unit structures 121*b* having line shapes extending in the first direction C1. The unit structures 121*b* may have different widths, depending on their locations, in the first direction C1.

In some embodiments, the unit structures 121*b* may have widths that decrease away from a center of the focus ring in the first direction C1. For example, a width W1 of an end portion of the unit structure 121*b* that is adjacent to an inner circumference of the focus ring may be greater than a width W2 of the other end portion of the unit structure 121*b* that is adjacent to an outer circumference of the focus ring. In this case, a distance D1 between the unit structures 121*b* that are adjacent to each other around the inner circumference of the focus ring may be less than a distance D2 between the unit structures 121*b* that are adjacent to each other around the outer circumference of the focus ring.

The trenches 123*b* may have widths that increase, depending on their locations, in the first direction C1. For example, widths of the trenches 123*b* around the inner circumference of the focus ring may be less than widths of the trenches 123*b* around the outer circumference of the focus ring.

Towards the inner circumference of the focus ring, the unit structures 121*b* have relatively great widths, and thus the electric field formation area may expand around the edge portion of the wafer.

Referring to FIG. 4B, unlike in FIG. 4A, uneven patterns 120*c* include unit structures 121*c* having line shapes. The unit structures 121*c* may have widths that increase, depending on their locations, in the first direction C1. For example, a width W3 of an end portion of the unit structure 121*c* that is adjacent to the inner circumference of the focus ring may be less than a width W4 of the other end portion of the unit structure 121*c* that is adjacent to the outer circumference of the focus ring. In this case, a distance D3 between the unit structures 121*c* that are adjacent to each other around the inner circumference of the focus ring may be greater than a distance D4 between unit structures 121c around the outer circumference of the focus ring.

The trenches 123c may have widths decreasing, depending on their locations, in the first direction C1. For example, a width of a portion of the trench 123c that is adjacent to the inner circumference of the focus ring may be greater than a width of a portion of the trench 123c that is adjacent to the outer circumference of the focus ring.

Since a distance between adjacent unit structures 121c relatively increases towards the inner circumference of the focus ring, the possibility of ions and/or radicals colliding with the focus ring may decrease. As a result, conductance of the ions and/or radicals around the edge portion of the wafer may increase.

Figure 5A:
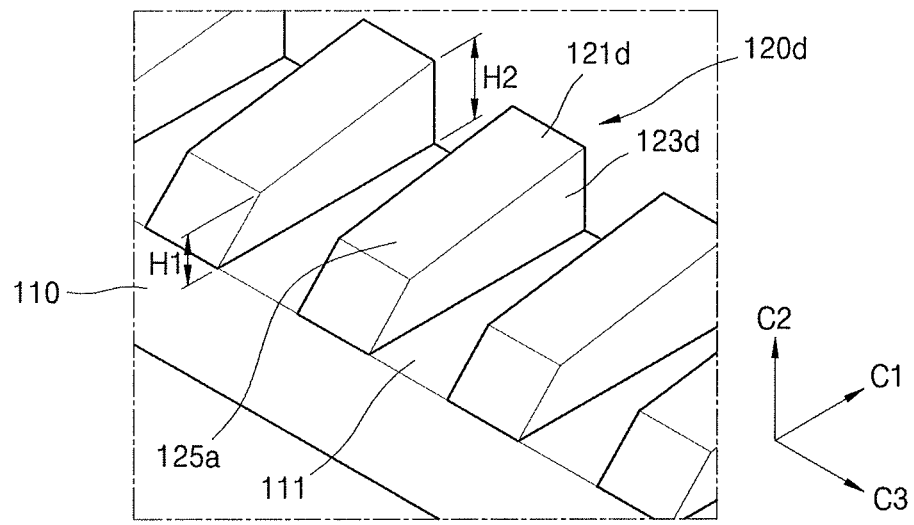
FIG. 5A illustrates an embodiment of an enlarged portion of a focus ring.
Figure 5B:
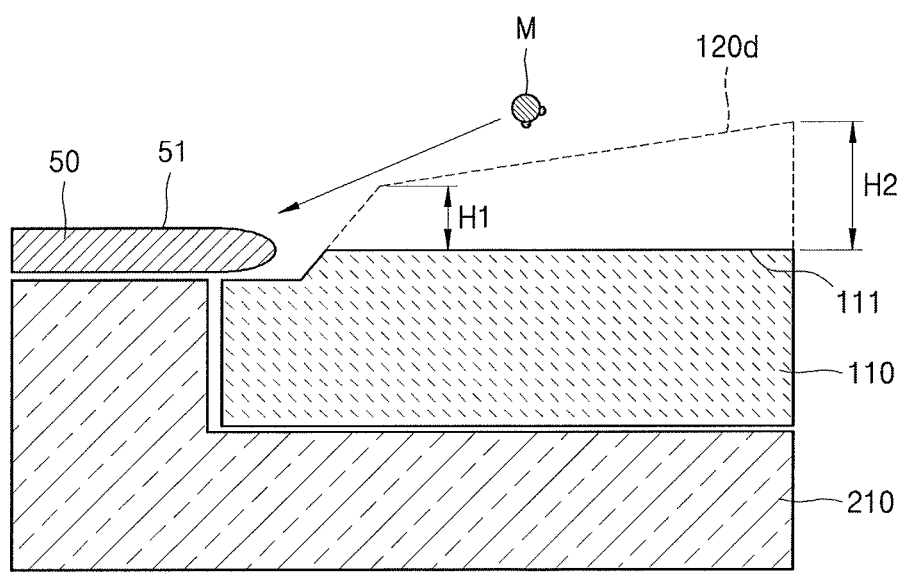
FIG. 5B illustrates an embodiment of a cross-sectional view of the focus ring in FIG. 5A that is on a lower electrode.

FIG. 5A illustrates an embodiment of a perspective view of an enlarged portion of a focus ring. FIG. 5B illustrates an embodiment of a cross-sectional view of the focus ring in FIG. 5A that is on the lower electrode 210.

Referring to FIGS. 5A and 5B, the focus ring may include uneven patterns 120d with unit structures 121d having line shapes extending in the first direction C1. The unit structures 121d may have upper surfaces 125a that are inclined, e.g., a height level of the upper surfaces 125a may change in the first direction C1. For example, the upper surfaces 125a of the unit structures 121d may be inclined so that the height level of the upper surfaces 125a increases towards the outer circumference of the focus ring. In one embodiment, a height level of a portion of the upper surface 125a of the unit structure 121d, which is adjacent to the inner circumference of the focus ring, may be lower than a height level of a portion of the upper surface 125a of the unit structure 121d, which is adjacent to the outer circumference of the focus ring.

For example, as illustrated in FIG. 5A, with respect to the upper surface 111 of the main body 110 that has a uniform height level, heights of the uneven patterns 120d in the second direction C2 may increase towards the outer circumference of the focus ring. For example, a height H1 of an end portion of the unit structure 121d, which is adjacent to the inner circumference of the focus ring, may be lower than a height H2 of the other end portion of the unit structure 121d, which is adjacent to the outer circumference of the focus ring. In this case, the depth of the trench 123d may gradually change towards the outer circumference of the focus ring.

As illustrated in FIG. 5B, since the portion of the upper surface 125a of the uneven pattern 120d, which is adjacent to the inner circumference of the focus ring, has a relatively lower height level than the portion of the upper surface 125a of the uneven pattern 120d, which is adjacent to the outer circumference of the focus ring, the possibility of ions and/or radicals M around the focus ring not colliding with the uneven patterns 120d and are incident to the edge portion of the wafer 50 may increase. Thus, a decrease in conductance of the ions and/or radicals M may be prevented. The decrease may result from continuous collision of the ions and/or radicals M, which have collided with the focus ring, with other ions and/or radicals M.

Figure 6A:
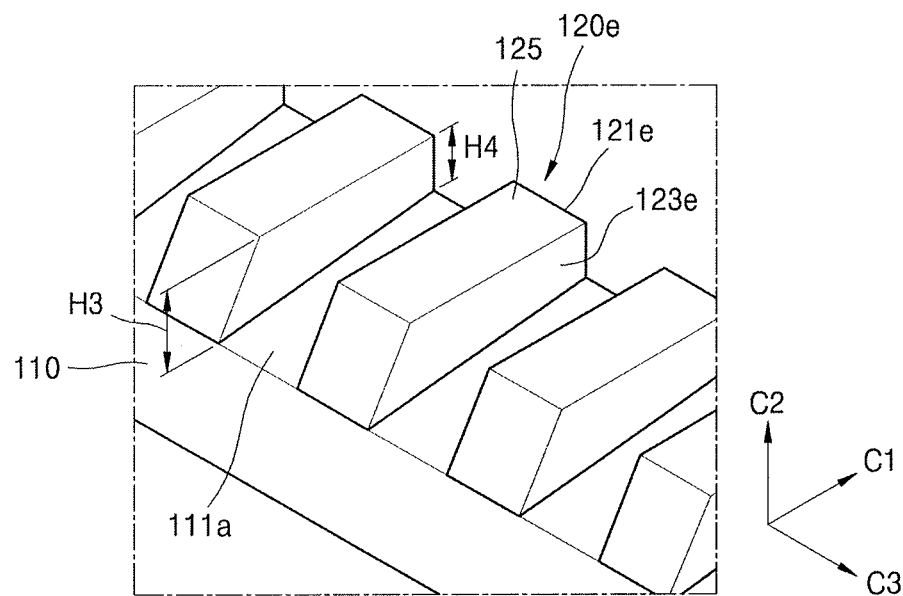
FIG. 6A illustrates another embodiment of an enlarged portion of a focus ring.
Figure 6B:
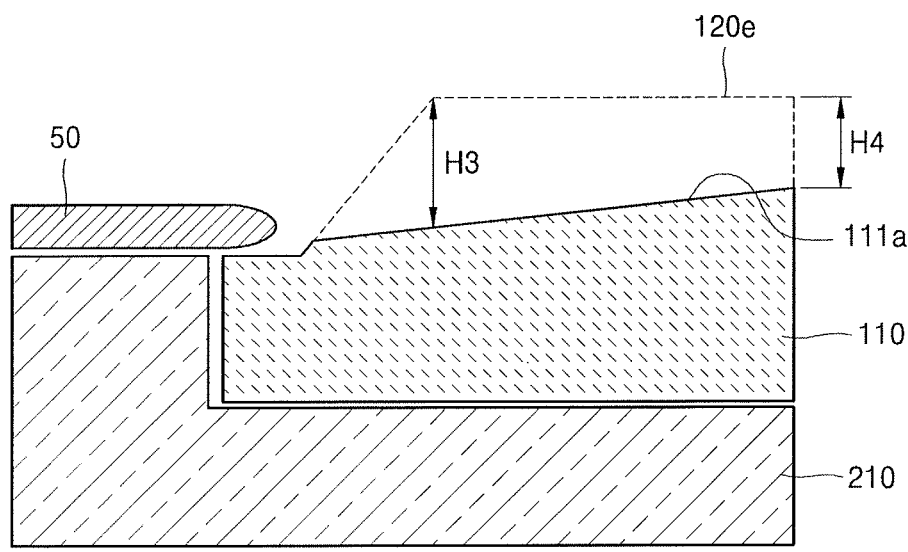
FIG. 6B illustrates an embodiment of a cross-sectional view of the focus ring in FIG. 6A that is on a lower electrode.

FIG. 6A illustrates another embodiment of a perspective view of an enlarged portion of a focus ring. FIG. 6B illustrates another embodiment of a cross-sectional view of the focus ring of FIG. 6A that is on a lower electrode.

Referring to FIGS. 6A and 6B, the focus ring may include the main body 110 and uneven patterns 120e including unit structures 121e extending in the first direction C1 and having line shapes. Heights of the unit structures 121e in the second direction C2 may differ in the first direction C1. For example, the main body 110 may have an inclined upper surface 11a having a height level that increases towards an outer circumference of the focus ring. The upper surface 125 of the unit structure 121e may be substantially parallel to a lower surface of the focus ring. When the focus ring on the lower electrode 210 surrounds an outer circumference of the wafer 50, the upper surface 125 of the unit structure 121e may be substantially parallel to the upper surface 51 of the wafer 50.

In this case, a height H3 of a portion of the unit structure 121e, which is adjacent to an inner circumference of the focus ring, may be greater than a height H4 of a portion of the unit structure 121e, which is adjacent to the outer circumference of the focus ring. Thus, the height of the unit structure 121e in the second direction C2 may gradually decrease in the first direction C1.

In one embodiment, the main body 110 has the inclined upper surface 111a having a height level that increases towards the outer circumference of the focus ring. When the unit structure 121e has upper surface 125 that is substantially parallel to the upper surface 51 of the wafer 50, the depth of a trench 123e may gradually decrease in the first direction C1. In this case, the thickness of the main body 110 may increase towards the outer circumference of the focus ring.

Due to the above-described structure, a path via which ions and/or radicals, which are incident between the unit structures 121e, move may increase in size. Thus, conductance of the ions and/or radicals may increase.

Figure 7:
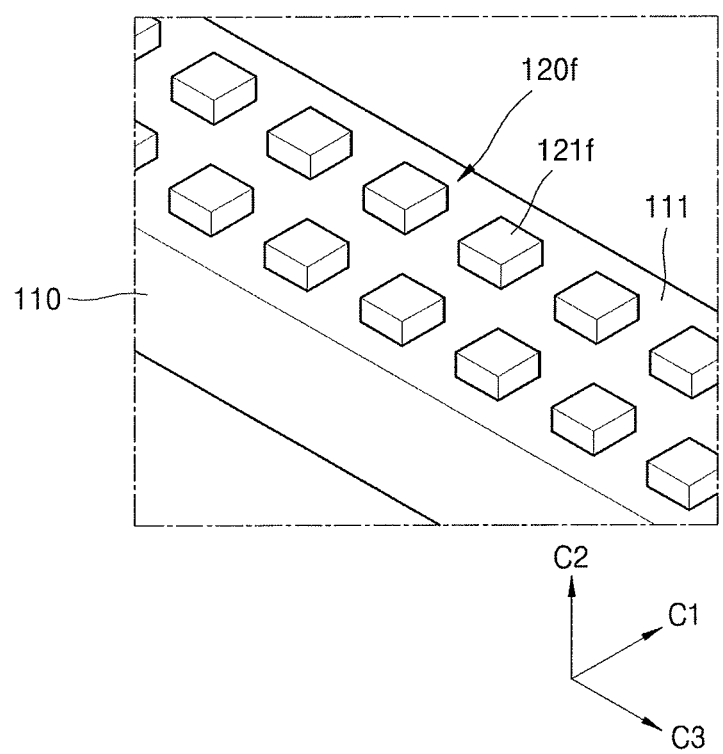
FIG. 7 illustrates another embodiment of an enlarged portion of a focus ring.

FIG. 7 illustrates another embodiment of a perspective view of an enlarged portion of a focus ring. Referring to FIG. 7, the focus ring may include the main body 110 and uneven patterns 120f including unit structures 121f arranged on the upper surface 111 of the main body 110, and the unit structures 121f may have dot shapes.

The unit structures 121f may be arranged in a matrix form. For example, the unit structures 121f may be arranged along an edge of the main body 110 and in the first direction C1. The unit structures 121f have dot shapes that serve to increase the surface area of the focus ring that may physically and/or chemically react with plasma during a plasma process. A temporal change of the focus ring (e.g., rate of height decrease of the focus ring) may decrease.

Two unit structures 121f are arranged in the first direction C1 in FIG. 7. In one embodiment, three or more unit structures 121f may be arranged in the first direction C1. Also, the unit structures 121f are arranged side-by-side in the first direction C1 in FIG. 7. In one embodiment, the unit structures 121f may be arranged in a zigzag pattern.

Shapes and sizes of the unit structures 121f and a distance between the unit structures 121f may vary according to a type of a plasma process and/or a process recipe.

Figure 8:
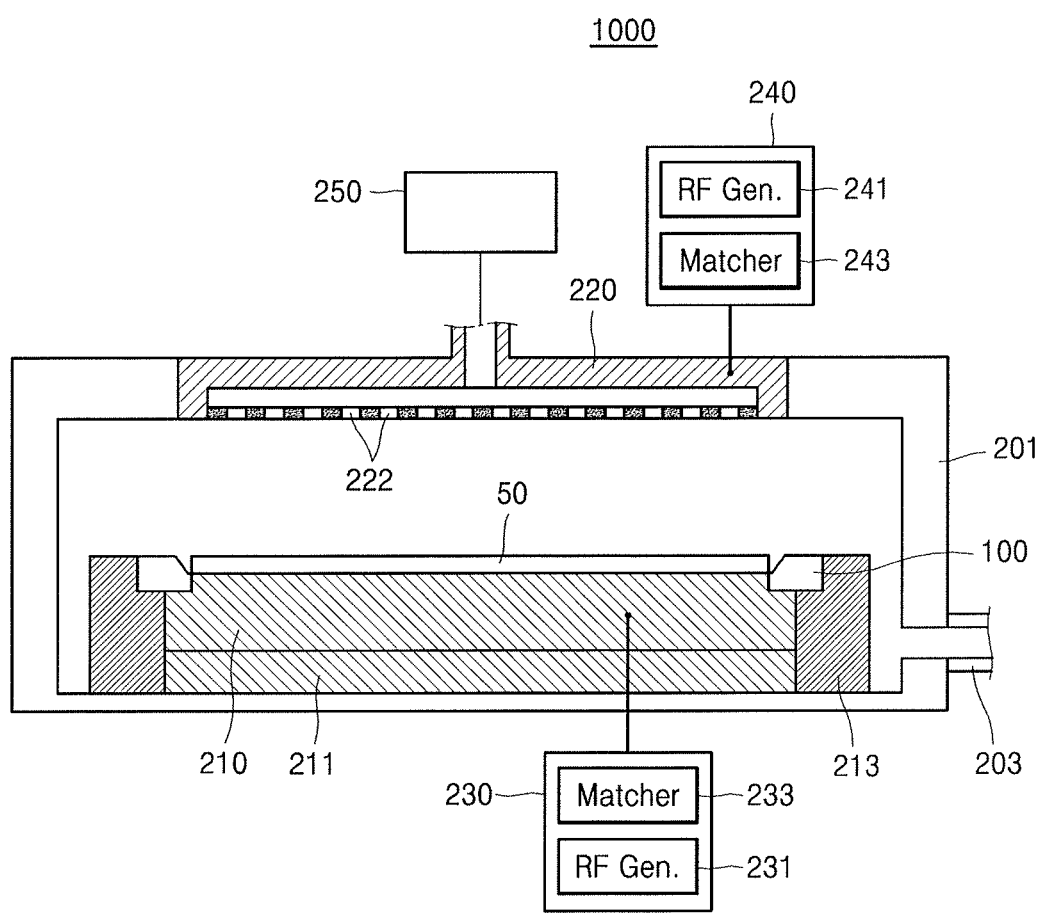
FIG. 8 illustrates an embodiment of a plasma-processing apparatus.

FIG. 8 illustrates an embodiment of a schematic cross-sectional view of a plasma-processing apparatus 1000 including the focus ring 100. Referring to FIG. 8, the plasma-processing apparatus 1000 may include a chamber 201, the upper electrode 220, the lower electrode 210, an upper power supply 240, a lower power supply 230, and the focus ring 100.

The chamber 201 may define a reaction space where plasma is produced. The reaction space may correspond to a space where wafers 50 are processed using plasma. The chamber 201 may seal the reaction space from the outside during a process of processing a wafer 50. The chamber 201 may generally include a metallic material and, for example, may maintain a ground state in order to block noise from the outside during a plasma process. An insulating liner may be on an inner surface of the chamber 201 to prevent damage to the chamber 201. The insulating liner may include ceramic, quartz, or another material.

An input/output gate may be on one side of the chamber 201. The wafers 50 are input/output to/from the chamber 201 through the input/output gate. Also, the chamber 201 may include an exhaust duct 203 for emitting a reaction gas or reaction by-products. The exhaust duct 203 may be connected to a vacuum pump. A pressure control valve, a flow control valve, etc., may be installed in the exhaust duct 203. Gas by-products generated within the chamber 201 during the plasma process may be emitted to the outside through the exhaust duct 203. Also, as the gas by-products generated within the chamber 201 are emitted to the outside through the exhaust duct 203, internal pressure of the chamber 201 may be adjusted.

In one embodiment, at least one viewport is formed in the chamber 201 and an inside of the chamber 201 may be monitored using the viewport. A probe, an Optical Emission Spectroscopy (OES) device, etc., may be coupled to the viewport in order to detect plasma density inside the chamber 201.

The upper electrode 220 may be installed in the chamber 201. A process gas may be provided to the upper electrode 220 from a gas supply unit 250. The upper electrode 220 may have therein a path through which the process gas flows. The process gas provided to the upper electrode 220 from the gas supply unit 250 may move through the path formed in the upper electrode 220 and then may be sprayed towards the wafer 50 mounted on the lower electrode 210 through gas injectors 222 on a lower surface of the upper electrode 220. The process gas may be, for example, a source gas, a reaction gas, a purge gas, etc., for the plasma process.

The upper power supply 240 may be electrically connected to the upper electrode 220 and may supply RF power to the upper electrode 220 to generate plasma by discharging the process gas. The upper power supply 240 may include an RF generator 241 and a matcher 243. The RF generator 241 may generate RF power. The matcher 243 may adjust an impedance to stabilize the plasma. There may be two or more RF generators 241. When there are multiple RF generators 241, RF power respectively provided by the RF generators 241 may have different frequencies.

The lower electrode 210 may be installed in the chamber 201 and may face the upper electrode 220. The wafer 50 may be fixed onto an upper surface of the lower electrode 210. For example, the lower electrode 210 may be an electrostatic chuck (ESC) that fixes the wafer 50 by using static electricity. The lower electrode 210 may include electrostatic electrodes for chucking and de-chucking the wafer 50, and power may be supplied to the lower electrode 210 from a direct current (DC) clamp power supply.

Also, the lower electrode 210 may be on a support member 211. In addition, the lower electrode 210 may include a heating member for heating the wafer 50 at a process temperature. The lower electrode 210 may be electrically connected to the lower power supply 230.

The lower power supply 230 may include an RF generator 231 and a matcher 233, and RF power may be supplied to the wafer 50. The RF power may be supplied to the wafer 50 and the focus ring 100 through the lower power supply 230 or may be directly supplied thereto. In one embodiment, there may be two or more RF generators 231. When there are multiple RF generators 231, RF power respectively provided by the RF generators 231 may have different frequencies. The matcher 233 may be between the lower electrode 210 and the RF generator 231.

The focus ring 100 may be on the lower electrode 210 and may surround the outer circumference of the wafer 50. The focus ring 100 may cover edges of the lower electrode 210 to prevent high-molecular weight compounds, which are generated during a plasma process, from penetrating the lower electrode 210. Also, when the RF power is applied to the upper electrode 220 and/or the lower electrode 210, high-frequency power is applied to the focus ring 100 so that the focus ring 100 may have an electric field formation region that expands around the edge portion of the wafer 50. As the electric field formation region expands around the edge portion of wafer 50, plasma generated in the reaction space may expand. An insulating ring 213 may be on an outer surface of the focus ring 100 to surround the focus ring 100 and the lower electrode 210. The focus ring 100 may include the focus rings described with reference to FIGS. 1A to 7.

At a time when the process gas diffuses in a space between the upper electrode 220 and the lower electrode 210, high-frequency power for discharging the process gas is applied to the upper electrode 220 and/or the lower electrode 210. As a result, process gas enters a plasma state and physical and/or chemical reactions occur based on contact between the plasma and a surface of the wafer 50. Due to these reactions, various treatment processes may be performed on the wafer 50.

In some embodiments, the plasma-processing apparatus 1000 may perform an etching process of etching the wafer 50 or a thin film on the wafer 50 based on a plasma reaction. For example, the plasma-processing apparatus 1000 may perform an etching process of patterning the wafer 50 or a thin film in at least one of a silicon layer, an oxide layer, a nitride layer, or a metal layer on the wafer 50.

According to the plasma-processing apparatus 1000 according to the one or more embodiments, the rate of temporal change of focus ring 100 may decrease. As a result, process characteristics of the edge portion of the wafer 50 may become uniform. Moreover, according to the one or more embodiments, since uneven patterns of the focus ring 100 increase conductance of ions and/or radicals around the edge portion of the wafer 50, process characteristics of the edge portion of wafer 50 may remain unchanged, which may increase the useful life of the focus ring 100.

In accordance with one or more embodiments, a focus ring includes a main body having a ring shape and a plurality of unit structures arranged in an uneven pattern adjacent to the main body. The unit structures are spaced from one another and may have varying sizes, e.g., varying widths, lengths, and/or heights in one or more directions.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A focus ring, comprising:
a main body having a ring shape; and
a plurality of unit structures arranged in an uneven pattern and protruding from an upper surface of the main body, the plurality of unit structures being spaced apart from each other along an outer circumference of the main body.

2. The focus ring as claimed in claim 1, wherein the plurality of unit structures have line shapes extending in a radial direction.

3. The focus ring as claimed in claim 2, wherein adjacent ones of the plurality of unit structures are spaced apart from each other by a distance corresponding to a width of at least one of the adjacent ones of the plurality of unit structures.

4. The focus ring as claimed in claim 2, wherein widths of the plurality of unit structures in a horizontal direction decrease away from the main body.

5. The focus ring as claimed in claim 2, wherein widths of the plurality of unit structures in the radial direction decrease away from a center of the main body.

6. The focus ring as claimed in claim 2, wherein widths of the plurality of unit structures in the radial direction increase away from a center of the main body.

7. The focus ring as claimed in claim 2, wherein the plurality of unit structures have inclined upper surfaces with height levels that increase towards the outer circumference of the main body.

8. The focus ring as claimed in claim 2, wherein:
the upper surface of the main body is inclined to have a height level that increases towards the outer circumference of the main body, and
heights of the plurality of unit structures decrease towards the outer circumference of the main body.

9. The focus ring as claimed in claim 1, wherein the plurality of units structures have dot shapes.

10. A plasma-processing apparatus, comprising:
a chamber;
an upper electrode in the chamber;
a lower electrode facing the upper electrode in the chamber and supporting a wafer; and
a focus ring, surrounding an outer edge of the wafer, on the lower electrode, wherein the focus ring includes:
a main body having a ring shape, and
a trench in an upper portion of the focus ring and wherein the trench extends from an upper surface of the focus ring to a depth to define a plurality of unit structures arranged in an uneven pattern and protruding from an upper surface of the main body, such that the plurality of unit structures are spaced apart from each other along an outer circumference of the main body.

11. The plasma-processing apparatus as claimed in claim 10, wherein the trench has a line shape extending in a radial direction.

12. The plasma-processing apparatus as claimed in claim 11, wherein:
when the focus ring is on the lower electrode, the upper surface of the focus ring is at a higher level than an upper surface of the wafer, and
the trench extends from the upper surface of the focus ring to a lower level than the upper surface of the wafer.

13. The plasma-processing apparatus as claimed in claim 11, wherein the trench has a width that decreases downwards in a circumferential direction.

14. The plasma-processing apparatus as claimed in claim 11, wherein the trench has a width that increases or decreases in the radial direction.

15. The plasma-processing apparatus as claimed in claim 11, wherein:
the upper surface of the focus ring has a uniform height level, and
a depth of the trench decreases towards the outer circumference of main body of the focus ring.

16. A focus ring, comprising:
a main body having a ring shape; and
a plurality of unit structures adjacent to the main body,
wherein the plurality of unit structures are spaced from one another and wherein the plurality of unit structures extend from the main body to heights or widths, or both, that change in a predetermined direction.

17. The focus ring as claimed in claim 16, wherein the predetermined direction is a radial direction relative to the ring shape of the main body.

18. The focus ring as claimed in claim 16, wherein each of the plurality of unit structures have inclined surfaces.

19. The focus ring as claimed in claim 18, wherein the inclined surfaces extend in the predetermined direction.

20. The focus ring as claimed in claim 16, wherein each of the plurality of unit structures have tapered sides.

* * * * *

UNITED STATES PATENT AND TRADEMARK OFFICE
CERTIFICATE OF CORRECTION

PATENT NO. : 10,600,622 B2  
APPLICATION NO. : 15/682854  
DATED : March 24, 2020  
INVENTOR(S) : Jaeseong Shin Page 1 of 1

It is certified that error appears in the above-identified patent and that said Letters Patent is hereby corrected as shown below:

On the Title Page

Item (73) Assignee:  
SAMUSUNG ELECTRONICS CO., LTD. Suwon-si, Gyeonggi-do (KR)  
Should read:  
SAMSUNG ELECTRONICS CO., LTD. Suwon-si, Gyeonggi-do (KR)

Signed and Sealed this  
Twenty-eighth Day of December, 2021

Drew Hirshfeld  
*Performing the Functions and Duties of the*  
*Under Secretary of Commerce for Intellectual Property and*  
*Director of the United States Patent and Trademark Office*